(12) United States Patent
Okita

(10) Patent No.: US 9,459,508 B2
(45) Date of Patent: Oct. 4, 2016

(54) DISPLAY DEVICE

(71) Applicant: Japan Display Inc., Minato-ku (JP)

(72) Inventor: Mitsutaka Okita, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/965,151

(22) Filed: Dec. 10, 2015

(65) Prior Publication Data

US 2016/0187751 A1    Jun. 30, 2016

(30) Foreign Application Priority Data

Dec. 25, 2014 (JP) ................. 2014-262763

(51) Int. Cl.
| | |
|---|---|
| *H01L 29/15* | (2006.01) |
| *G02F 1/1362* | (2006.01) |
| *G02F 1/1368* | (2006.01) |
| *G02F 1/1333* | (2006.01) |
| *G02F 1/1343* | (2006.01) |
| *H01L 27/12* | (2006.01) |

(52) U.S. Cl.
CPC ....... *G02F 1/136286* (2013.01); *G02F 1/1368* (2013.01); *G02F 1/133345* (2013.01); *G02F 1/134309* (2013.01); *G02F 1/136227* (2013.01); *H01L 27/1214* (2013.01)

(58) Field of Classification Search
CPC ............. G02F 1/136286; G02F 1/133345; G02F 1/134309; G02F 1/136227; G02F 1/1368; H01L 27/1214; H01L 27/124
USPC ..................................................... 257/72, 59
See application file for complete search history.

(56) References Cited

U.S. PATENT DOCUMENTS

| | | | |
|---|---|---|---|
| 9,058,787 B2 * | 6/2015 | Kim ..................... | G09G 3/3614 |
| 2009/0195489 A1 * | 8/2009 | Hung ................. | G02F 1/136286 345/92 |
| 2011/0291550 A1 | 12/2011 | Kim et al. | |

FOREIGN PATENT DOCUMENTS

JP    2011-249334    12/2011

* cited by examiner

*Primary Examiner* — Tu-Tu Ho
(74) *Attorney, Agent, or Firm* — Oblon, McClelland, Maier & Neustadt, L.L.P.

(57) ABSTRACT

According to one embodiment, a display device includes a first signal line, a second signal line, a first switching element, a second switching element, an insulating film, a first contact hole, a second contact hole, a first pixel electrode and a second pixel electrode. The first contact hole is formed in the insulating film, and located between the first signal line and the second signal line. The second contact hole is formed in the insulating film, located opposite to the first contact hole with respect to the second signal line, and also located side by side with the first contact hole in the first direction.

8 Claims, 12 Drawing Sheets

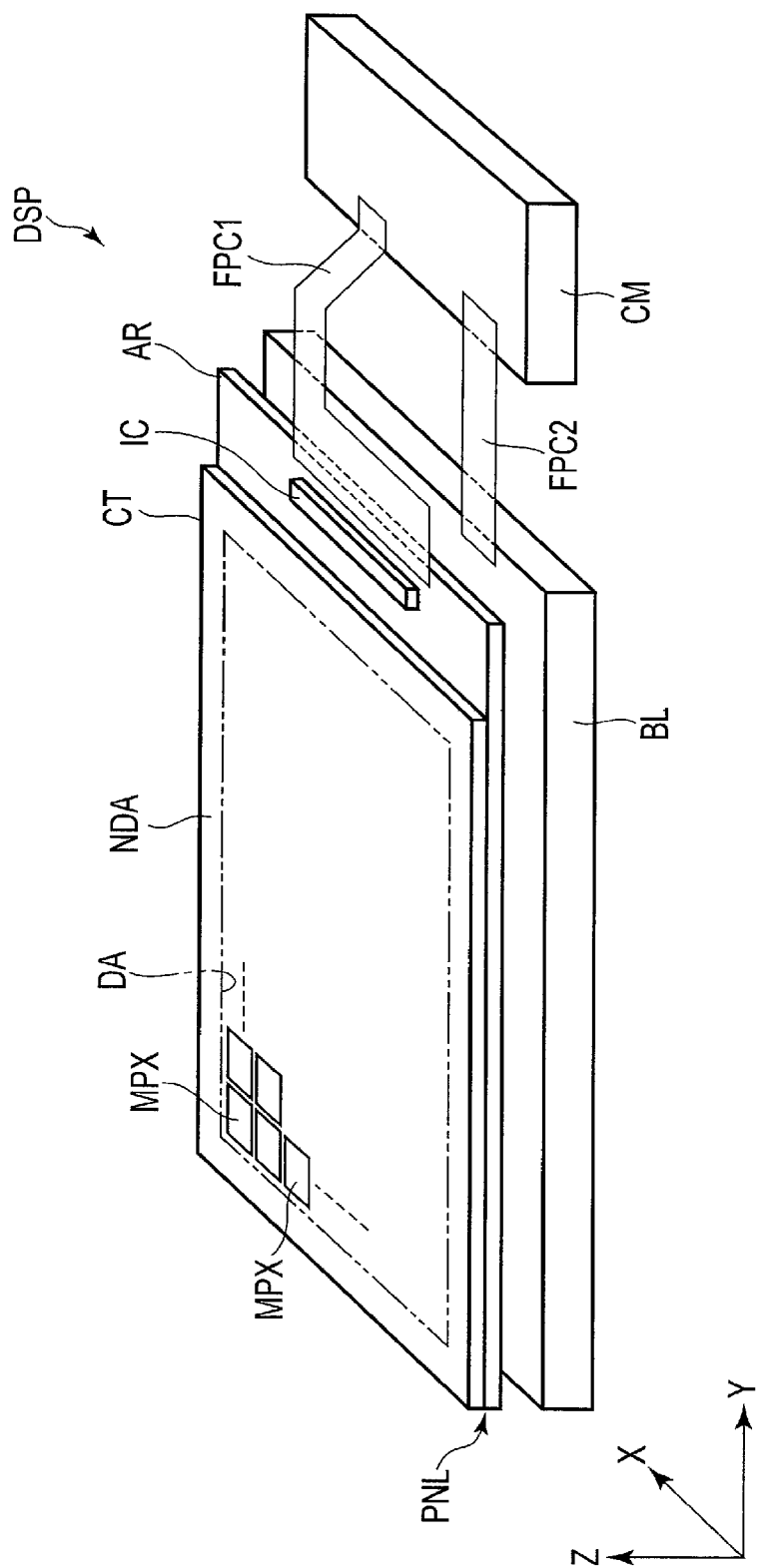
F I G. 1

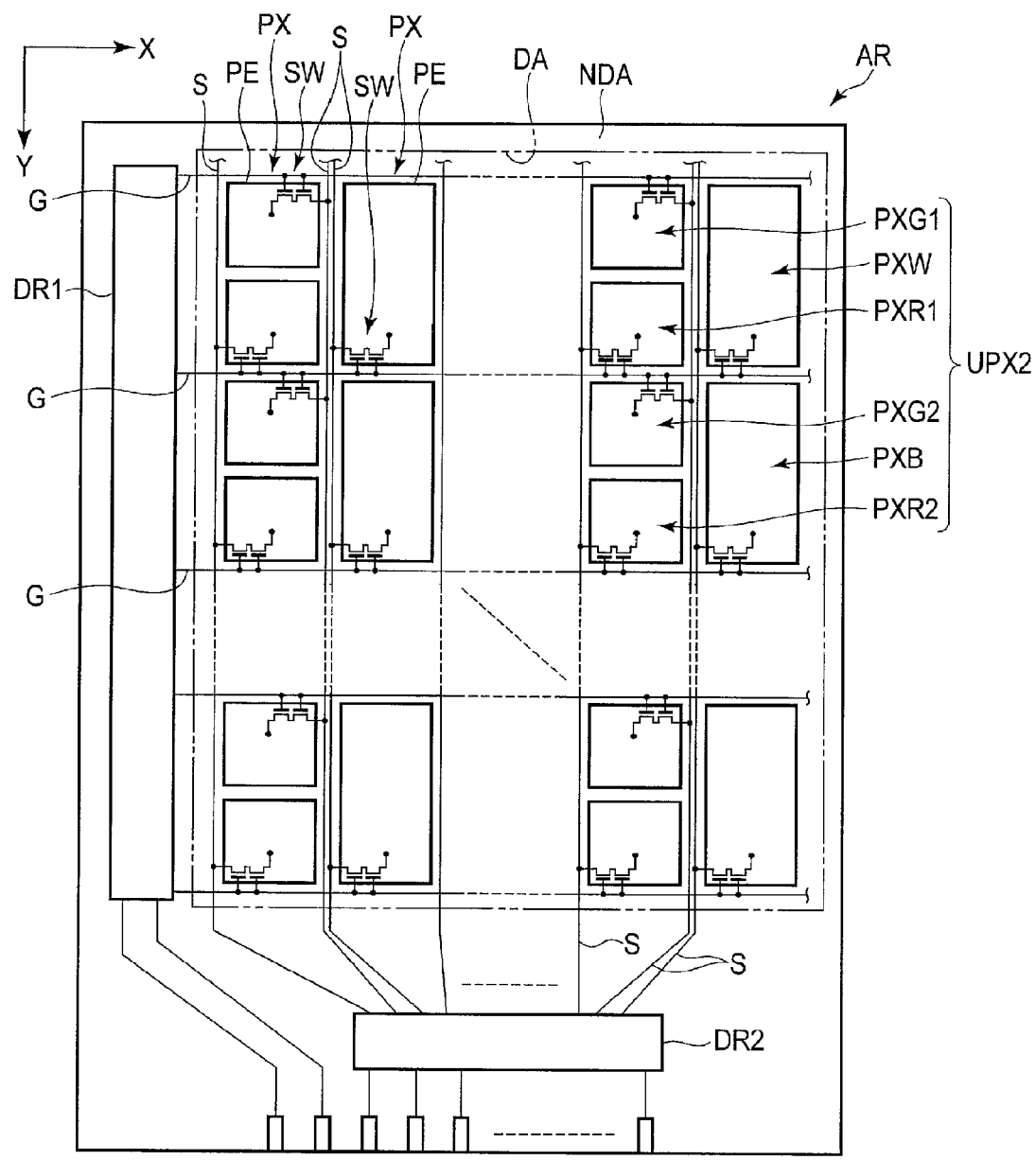
F I G. 4

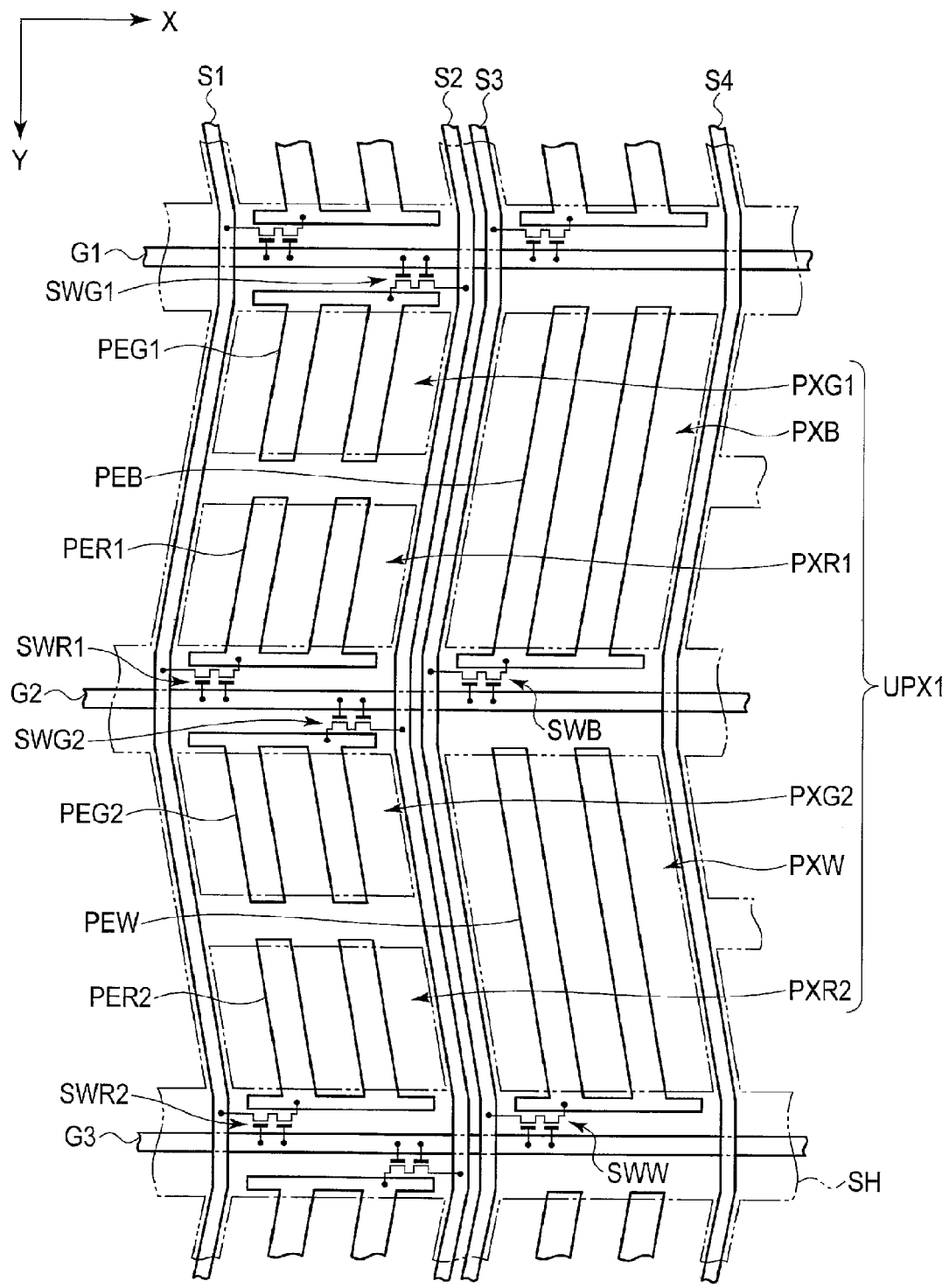
F I G. 5

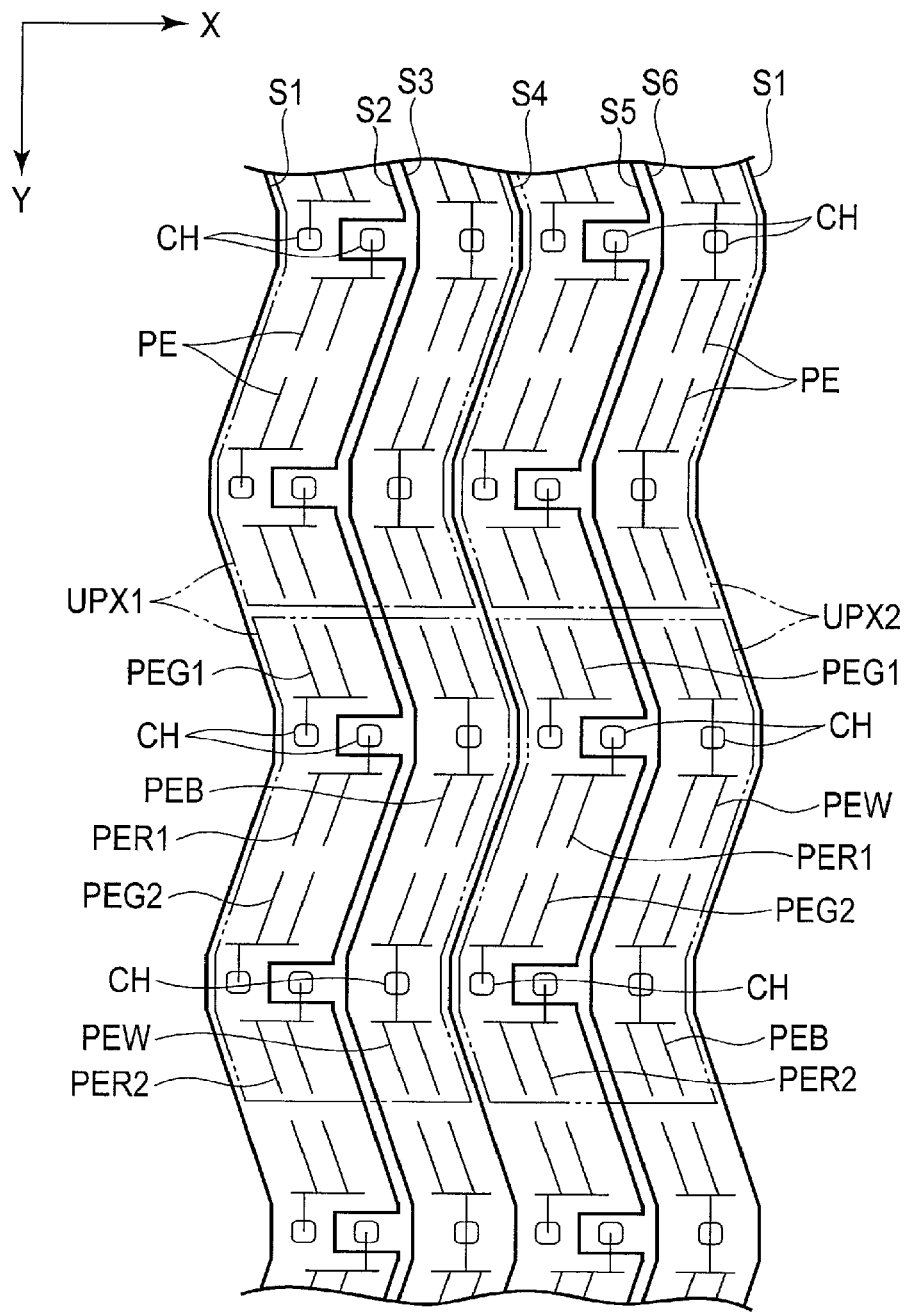
F I G. 11

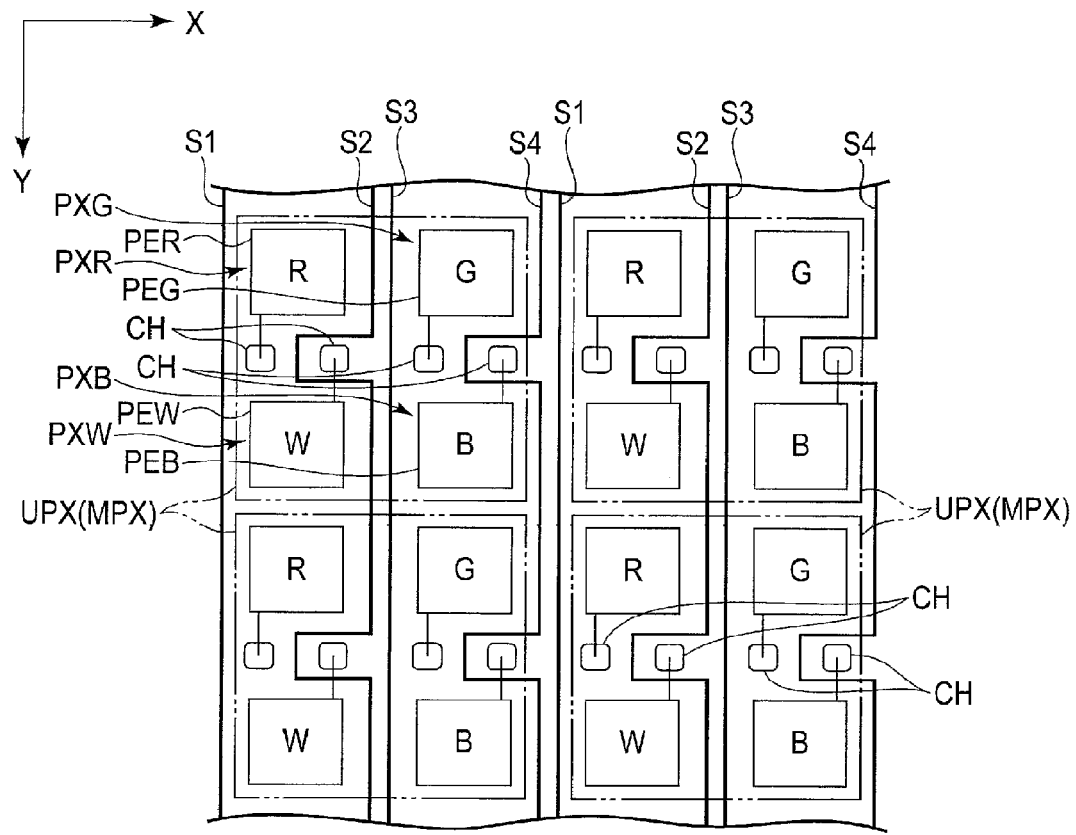
F I G. 12

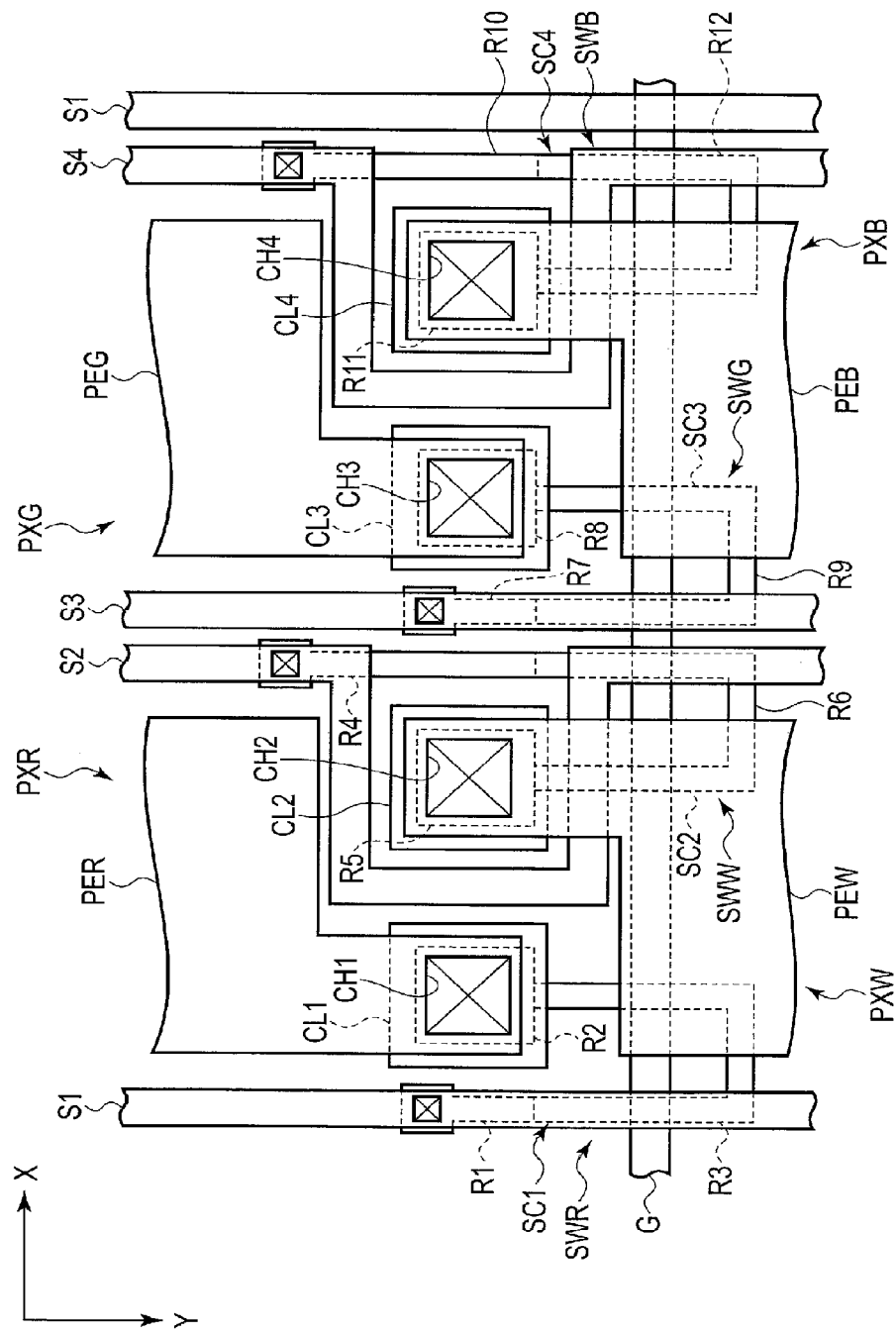
F I G. 13

DISPLAY DEVICE

CROSS-REFERENCE TO RELATED APPLICATIONS

This application is based upon and claims the benefit of priority from Japanese Patent Application No. 2014-262763, filed Dec. 25, 2014, the entire contents of which are incorporated herein by reference.

FIELD

Embodiments described herein relate generally to a display device.

BACKGROUND

In recent years, display devices for use in smartphones or tablet computers have been further required to have a higher resolution and a higher aperture ratio. If pixels are made smaller in order to have a higher resolution, the ratio of the total area of signal lines and a light-shielding layer to the total area of the pixels is increased, thus reducing the aperture ratio. An organic electroluminescence display device is disclosed as an example of a technique for ensuring a given aperture ratio, while achieving a higher resolution. The organic electroluminescence display device includes a first-color sub-pixel, a second-color sub-pixel, and a third-color sub-pixel. The first-color sub-pixel and the second-color sub-pixels are disposed in the same column. The third-color sub-pixel is disposed in another column adjacent to the column in which the first-color and second-color sub-pixels are disposed.

BRIEF DESCRIPTION OF THE DRAWINGS

FIG. 1 is a perspective view showing a liquid crystal display device according to an embodiment.

FIG. 4 is a plan view showing the configuration of an array substrate as shown in FIGS. 1 and 2.

FIG. 5 is a view showing the configuration of a unit pixel in the liquid crystal display panel, and also showing a relationship in electrical connection between scanning lines, signal lines, switching elements and pixel electrodes.

FIG. 11 is a configuration view of part of an array substrate in a liquid crystal display device according to modification 2 of the above embodiment, and also shows signal lines, contact holes and pixel electrodes.

FIG. 12 is a configuration view of part of an array substrate in a liquid crystal display device according to modification 3 of the above embodiment, and also shows signal lines, contact holes and pixel electrodes.

FIG. 13 is an enlarged plan view of part of a unit pixel as shown in FIG. 12.

DETAILED DESCRIPTION

Figure 2:
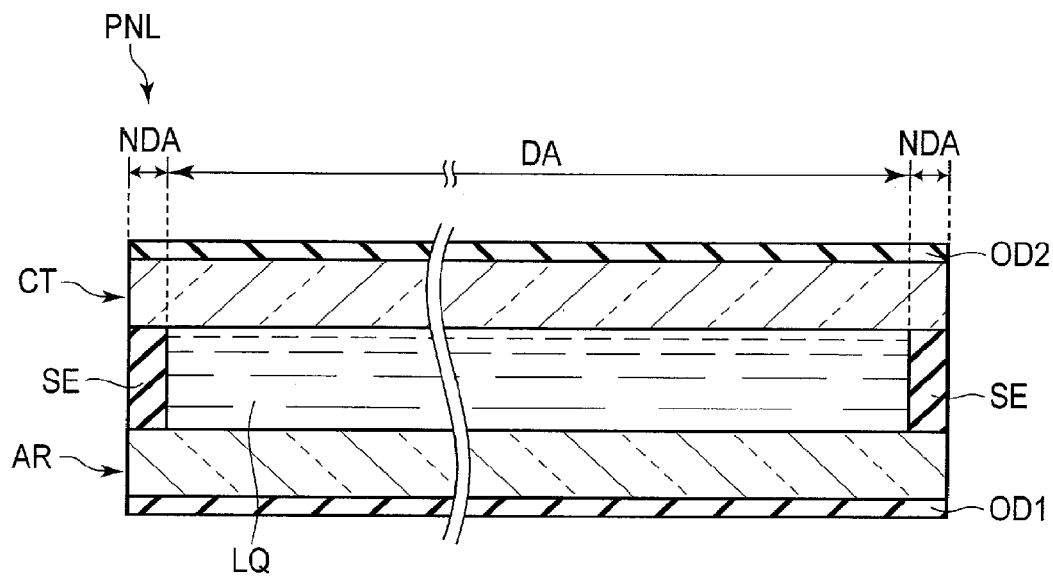
FIG. 2 is a cross-sectional view showing a liquid crystal display panel as shown in FIG. 1.

In general, according to one embodiment, there is provided a display device comprising: a first signal line; a second signal line spaced from the first signal line; a first switching element connected to the first signal line; a second switching element connected to the second signal line; an insulating film provided above the first switching element, the second switching element, the first signal line and the second signal line; a first contact hole formed in the insulating film and located between the first and second signal lines; a second contact hole formed in the insulating film, located opposite to the first contact hole with respect to the second signal line, and also located side by side with the first contact hole in a first direction; a first pixel electrode formed above the insulating film, and electrically connected to the first switching element through the first contact hole; and a second pixel electrode formed above the insulating film, electrically connected to the second switching element through the second contact hole, and located opposite to the first pixel electrode in a second direction perpendicular to the first direction.

Embodiments and modifications will be described hereinafter with reference to the accompanying drawings. The disclosure is a mere example, and arbitrary change of gist which can be easily conceived by a person of ordinary skill in the art naturally falls within the inventive scope. To better clarify the explanations, the drawings may pictorially show width, thickness, shape, etc., of each portion as compared with an actual aspect, but they are mere examples and do not restrict the interpretation of the invention. In the present specification and drawings, after structural elements are each explained once with reference to the drawings, there is a case where their explanations will be omitted as appropriate, and those identical to or similar to the explained structural elements will be denoted by the same reference numbers, respectively, as the explained structural elements.

First of all, a display device according to an embodiment will be described in detail.

With respect to this embodiment, as an example of the display device, a liquid crystal display device will be described. This liquid crystal display device can be used in various devices such as a smartphone, a tablet computer, a cell phone, a personal computer, a television receiver, an in-vehicle device and a games console. Also, main structural elements described later with respect to the embodiment can be used in a self-luminous display device including an organic electroluminescent display element, etc., an electronic paper type display device including an electrophoretic element, etc., a display device to which micro-electro mechanical systems (MEMS) is applied or a display device to which electrochromism is applied.

FIG. 1 is a perspective view schematically showing the configuration of a liquid crystal display device DSP. In the embodiment, a first direction X and a second direction Y are perpendicular to each other; however, they may intersect each other at an angle other than 90°. Also, a third direction Z is perpendicular to each of the first direction X and the second direction Y.

The liquid crystal display device DSP comprises an active-matrix liquid crystal display panel PNL, a driver IC chip IC which drives the liquid crystal display panel PNL, a backlight unit BL which illuminates the liquid crystal display panel PNL, a control module CM, flexible wiring boards FPC1 and FPC2, etc.

The liquid crystal display panel PNL comprises an array substrate AR and a counter-substrate CT located opposite to the array substrate AR. In the embodiment, the array substrate AR functions as a first substrate, and the counter-substrate CT functions as a second substrate. The liquid crystal display panel PNL includes a display area DA which displays an image and a non-display area NDA which is formed in the shape of a frame in such a way as to surround the display area DA. The liquid crystal display panel PNL comprises a plurality of main pixels MPX which are arranged in a matrix in the first direction X and the second direction Y in the display area DA. Each of the main pixels MPX corresponds to a group of three sub-pixels to be described later.

The backlight unit BL is provided on a rear surface of the array substrate AR. As the structure of the backlight unit BL, various structures can be applied. However, a detailed explanation of the structure of the backlight unit BL will be omitted. The driver IC chip IC is mounted on the array substrate AR. The flexible wiring board FPC1 connects the liquid crystal display panel PNL and the control module CM. The flexible wiring board FPC2 connects the backlight unit BL and the control module CM to each other.

The liquid crystal display device DSP having the above structure is a so-called transmissive liquid crystal display device in which sub-pixels are selectively caused to transmit therethrough light incident from the backlight unit BL on the liquid crystal display panel PNL to display an image. However, the liquid crystal display device DSP may be provided as a reflective liquid crystal display device in which sub-pixels are selectively caused to reflect natural light (external light) emitted from the outside toward the liquid crystal display panel PNL to display an image or as a transreflective liquid crystal display device having both the functions of the transmissive and reflective liquid crystal display devices.

FIG. 2 is a cross-sectional view of the liquid crystal display panel PNL.

As shown in FIG. 2, the liquid crystal display panel PNL comprises the array substrate AR, the counter-substrate CT, a liquid crystal layer LQ, a sealing member SE, a first optical element OD1, a second optical element OD2, etc. The array substrate AR and the counter-substrate CT will be described later in detail.

The sealing member SE is located in the non-display area NDA, and joins the array substrate AR and the counter-substrate CT to each other. The liquid crystal layer LQ is held between the array substrate AR and the counter-substrate CT. The first optical element OD1 and the liquid crystal layer LQ are located on opposite sides of the array substrate AR, respectively; that is, they are located opposite to each other with respect to the array substrate AR. The second optical element OD2 and the liquid crystal layer LQ are located on opposite sides of the counter-substrate CT, respectively; that is, they are located opposite to each other with respect to the counter-substrate CT. The first optical element OD1 and the second optical element OD2 each include a polarizer. It should be noted that each of the first optical element OD1 and the second optical element OD2 may include another optical element such as a retardation film.

Figure 3:
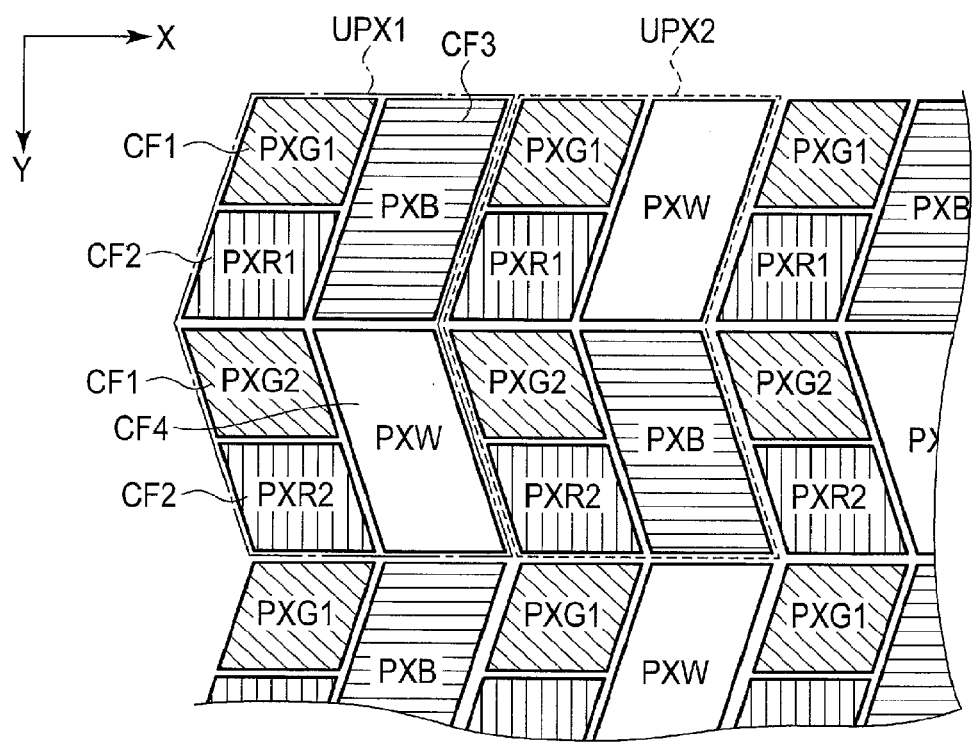
FIG. 3 is a view showing an example of an arrangement of pixels in the liquid crystal display panel as shown in FIGS. 1 and 2.

FIG. 3 is a view showing an example of a pixel array in the display area DA in the liquid crystal display panel PNL. FIG. 3 shows two kinds of unit pixels, i.e., unit pixels UPX1 and UPX2.

In such a manner, as shown in FIG. 3, the liquid crystal display panel PNL includes two kinds of unit pixels. That is, as the unit pixels, unit pixels UPX1 and UPX2 are provided. Each of the unit pixels UPX1 and UPX2 is minimum unit for use in displaying a color image. The unit pixels UPX1 and UPX2 each include sub-pixels PXG1, PXR1, PXB, PXG2, PXR2 and PXW.

The sub-pixels PXG1 and PXG2 are first-color pixels, and include color filters CF1 having a first color. The sub-pixels PXR1 and PXR2 are second-color pixels, and include color filters CF2 having a second color. The sub-pixel PXB is a third-color pixel, and includes a color filter CF3 having a third color. The sub-pixel PXW is a fourth-color pixel, and includes a color filter CF4 having a fourth color. For example, the first color is green; the second color is red; the third color is blue; and the fourth color is white or substantially transparent. The color filters CF1 to CF3 are formed of resin materials having different colors. The color filter CF4 is formed of a transparent resin material or a resin material having a faint color. Thus, there can be a case where the color filter CF4 should be referred to as a non-tinted filter.

However, each of the unit pixels UPX1 and UPX2 may include sub-pixels of colors other than green, red, blue and white, or may be made up of three sub-pixels excluding a white sub-pixel, i.e., green, red and blue sub-pixels. Furthermore, in accordance with the configuration of each unit pixel, in the display area DA, one kind of unit pixels UPX (i.e., either unit pixels UPX1 or unit pixels UPX2) may be arranged, or three or more kinds of unit pixels UPX (unit pixels UPX1 and UPX2 and unit pixels which differ in structure from the unit pixels UPX1 and UPX2) may be arranged.

In the following description, for example, light having a wavelength which falls within the range of 380 to 780 nm is defined as "visible light". "Blue" is defined as color of light whose transmittance has a peak falling within a first wavelength range of 380 nm or more less than 490 nm. "Green" is defined as color of light whose transmittance has a peak falling within a second wavelength range of 490 nm or more less than 590 nm. "Red" is defined as color of light whose transmittance has a peak falling within a third wavelength range of 590 nm or more less than 780 nm. The "substantially transparent" filter covers a faintly colored filter whose color corresponds to any color of the above-defined visible light, in addition to a non-tinted filter.

Unit pixels UPX1 are arranged in the second direction Y as a column of unit pixels UPX1. Similarly, unit pixels UPX2 are arranged in the second direction Y as a column of unit pixels UPX2. To be more specific, a plurality of columns of unit pixels UPX1 in the second direction Y and a plurality of columns of unit pixels UPX2 in the second direction Y are alternately arranged in the first direction X.

In each of the unit pixels UPX1 and UPX2, the sub-pixels PXG1 and PXR1 are adjacent to each other in the second direction Y; the sub-pixels PXG2 and PXR2 are also adjacent to each other in the second direction Y; and the sub-pixels PXR1 and PXG2 are also adjacent to each other in the second direction Y. In each unit pixel UPX1, the sub-pixels PXG1 and PXR1 are adjacent to the sub-pixel PXB in the first direction X; and the sub-pixels PXG2 and PXR2 are adjacent to the sub-pixel PXW in the first direction X. In each unit pixel UPX2, the sub-pixels PXG1 and PXR1 are adjacent to the sub-pixel PXW in the first direction X; and the sub-pixels PXG2 and PXR2 are adjacent to the sub-pixel PXB in the first direction X. Furthermore, in any adjacent unit pixels UPX1 and UPX2, the sub-pixel PXB in the unit pixel UPX1 are adjacent to the sub-pixels PXG1 and PXR1 in the unit pixel UPX2 in the first direction X. Also, the sub-pixel PXW in the unit pixel UPX1 is adjacent to the sub-pixels PXG2 and PXR2 in the unit pixel UPX2 in the first direction X.

In the example shown in FIG. 3, in each of the unit pixels UPX1 and UPX2, the sub-pixels PXG1, PXG2, PXR1 and PXR2 have the substantially the same first area. Each of the sub-pixels PXB and PXW has a second area which is larger than the first area. For example, the second area is almost double the first area. For example, the sub-pixels PXG1, PXG2, PXR1, PXR2, PXB and PXW have substantially the same width in the first direction X, and in the second direction Y, the sub-pixels PXB and PXW have a length which is almost double that of each of the sub-pixels PXG1, PXG2, PXR1 and PXR2. That is, the sizes of the sub-pixels PXB and PXW, which are blue and white sub-pixels, respectively, are greater than those of the sub-pixels PXR1 and PXR2, which are red sub-pixels, and those of the sub-pixels PXG1 and PXG2, which are green sub-pixels; and the number of the sub-pixels PXB and PXW is smaller than that of the sub-pixels PXR1, PXR2, PXG1 and PXG2. By virtue of this feature, the aperture ratios of the unit pixels UPX1 and UPX2 can be improved without reducing an effective resolution.

It should be noted that the area of the sub-pixel PXB may be different from that of the sub-pixel PXW. Also, the sub-pixels PXG1, PXG2, PXR1 and PXR2 may have different areas.

The color filters CF1 to CF4 are disposed in accordance with the layouts of the above sub-pixels, and have areas determined in accordance with the sizes of the sub-pixels. To be more specific, the color filters CF1 are arranged in a predetermined pattern, the color filters CF2 are also arranged in a predetermined pattern, and the color filters CF1 and CF2 are alternately arranged in the second direction Y. The color filters CF1 and CF2 have substantially the same first area. Also, the color filters CF3 are arranged in a predetermined pattern, the color filters CF4 are also arranged in a predetermined pattern, and the color filters CF3 and CF4 are alternately arranged in the second direction Y. The color filters CF3 and CF4 have substantially the same second area, which is larger than the first area. For example, the second area is almost double the first area.

Furthermore, the shape of each of the above sub-pixels is not limited to such a substantial parallelogram as shown in FIG. 3. That is, it may be a square or a rectangle which is longitudinal in the second direction Y.

For example, in the case where the shape of each of the sub-pixels is a substantial parallelogram, two kinds of unit pixels, i.e., the unit pixels UPX1 and UPX2, are combined, thereby also forming a larger number of domains with respect to the sub-pixels PXB and PXW, and thus compensating for a viewing-angle characteristic. Thus, with respect to the viewing-angle characteristic, the combination of the unit pixels UPX1 and UPX2 (two unit pixels) is a minimum unit in a displayed color image.

It should be noted that each of the unit pixels UPX1 and UPX2 is made up of two main pixels MPX. In each unit pixel UPX1, one of the two main pixels MPX comprises three adjacent sub-pixels PXG1, PXR1 and PXB, and the other comprises three adjacent sub-pixels PXG2, PXR2 and PXW. In each unit pixel UPX2, one of the two main pixels MPX comprises three adjacent sub-pixels PXG1, PXR1 and PXW, and the other comprises three adjacent sub-pixels PXG2, PXR2 and PXB.

FIG. 4 is a plan view showing the configuration of the array substrate AR.

As shown in FIG. 4, the array substrate AR comprises scanning lines G, signal lines S, pixel electrodes PE, switching elements SW, a first drive circuit DR1, a second drive circuit DR2, etc.

In the display area DA, the scanning lines G extend in the first direction X, and are arranged and spaced from each other in the second direction Y. In the embodiment, the scanning lines G linearly extend in the first direction X. Also, in the display area DA, the signal lines S extend in the second direction Y intersect the scanning lines G, and are arranged and spaced from each other in the first direction X. It should be noted that the signal lines S need not always linearly extend; i.e., they may be partially bent or extend in a direction intersecting the first direction X and the second direction Y. In each sub-pixel PX, a pixel electrode PE and a switching element SW are provided. The switching element SW is electrically connected to an associated scanning line G and an associated signal line S. The pixel electrode PE is electrically connected to the switching element SW.

In the example shown in FIG. 4, each of unit pixels UPX2 includes sub-pixels PXG1, PXR1, PXW, PXG2, PXR2 and PXB. In such a manner, each unit pixel UPX2 includes six sub-pixels; and three signal lines S and three scanning lines G are assigned to each unit pixel UPX2.

The first drive circuit DR1 and the second drive circuit DR2 are disposed in the non-display area NDA. The first drive circuit DR1 is electrically connected to portions of the scanning lines G which are located in the non-display area NDA. The second drive circuit DR2 is electrically connected to portions of the signal lines S which are located in the non-display area NDA. The first drive circuit DR1 supplies a control signal to each of the scanning lines G. The second drive circuit DR2 supplies an image signal (for example, a video signal) to each of the signal lines S.

FIG. 5 is a view showing the configuration of a unit pixel UPX1 in the liquid crystal display panel PNL. Also, FIG. 5 shows a relationship in electrical connection among scanning lines G, signal lines S, switching elements SW and pixel electrodes PE.

It should be noted that in the example shown in FIG. 5, the unit pixel UPX1 has a structure adapted for a fringe field switching (FFS) mode which is a display mode, and in FIG. 5, a common electrode is not shown. Scanning lines G1 to G3 and signal lines S1 to S4 are formed in the above array substrate, whereas a light-shielding layer SH is formed in the above counter-substrate. It should be noted that in the drawings, the light-shielding layer SH is indicated by a two-dot chain line.

As shown in FIG. 5, if the sub-pixels PX, the scanning lines G and the signal lines S are observed, the following positional relationship is established.

The sub-pixels PXG1, PXR1, PXG2 and PXR2 are formed between the signal line S1 (first signal line) and the signal line S2 (second signal line). The sub-pixels PXG1 and PXR1 are adjacent to each other in the second direction Y, with no scanning line interposed between them. The sub-pixels PXR1 and PXG2 are adjacent to each other in the second direction Y, with the scanning line G2 interposed between them. The sub-pixels PXG2 and PXR2 are adjacent to each other in the second direction Y, with no scanning line interposed between them. The sub-pixels PXB and PXW are formed between the signal line S3 (third signal line) and the signal line S4 (fourth signal line). The sub-pixels PXB and PXW are adjacent to each other in the second direction Y, with the scanning line G2 interposed between them. The scanning lines G1 to G3 are formed without crossing any of the sub-pixels. The sub-pixel PXB is adjacent to the sub-pixels PXG1 and PXR1 in the first direction X, with the signal lines S2 and S3 interposed between the sub-pixel PXB and the sub-pixels PXG1 and PXR1. The sub-pixel PXW is adjacent to the sub-pixels PXG2 and PXR2 in the first direction X, with the signal lines S2 and S3 interposed between the sub-pixel PXW and the sub-pixels PXG2 and PXR2.

The sub-pixel PXG1 comprises a switching element SWG1 electrically connected to the signal line S2 and the scanning line G1 and a pixel electrode PEG1 electrically connected to the switching element SWG1.

The sub-pixel PXR1 comprises a switching element SWR1 electrically connected to the signal line S1 and the scanning line G2 and a pixel electrode PER1 electrically connected to the switching element SWR1.

The sub-pixel PXG2 comprises a switching element SWG2 electrically connected to the signal line S2 and the scanning line G2 and a pixel electrode PEG2 electrically connected to the switching element SWG2.

The sub-pixel PXR2 comprises a switching element SWR2 electrically connected to the signal line S1 and the scanning line G3 and a pixel electrode PER2 electrically connected to the switching element SWR2.

The sub-pixel PXB comprises a switching element SWB electrically connected to the signal line S3 and the scanning line G2 and a pixel electrode PEB electrically connected to the switching element SWB.

The sub-pixel PXW comprises a switching element SWW electrically connected to the signal line S3 and the scanning line G3 and a pixel electrode PEW electrically connected to the switching element SWW.

On the other hand, if the pixel electrode PE, the scanning lines G and the signal lines S are observed, the following positional relationship is established.

The pixel electrodes PEG1, PER1, PEG2 and PER2 are formed between the signal lines S1 and S2. The pixel electrodes PEG1 and PER1 are adjacent to each other in the second direction Y, with no scanning line interposed between them. The pixel electrodes PER1 and PEG2 are adjacent to each other in the second direction Y, with the scanning line G2 interposed between them. The pixel electrodes PEG2 and PER2 are adjacent to each other in the second direction Y, with no scanning line interposed between them. Pixel electrodes PEB and PEW are located between the signal lines S3 and S4. The sub-pixels PEB and PEW are adjacent to each other in the second direction Y, with the scanning line G2 interposed between them. The scanning lines G1 to G3 are formed without crossing any of the sub-pixels. The sub-pixel PEB is adjacent to the pixel electrodes PEG1 and PER1 in the first direction X, with the signal lines S2 and S3 interposed between the sub-pixel PEB and the sub-pixels PEG1 and PER1. The sub-pixel PEW is adjacent to the pixel electrodes PEG2 and PER2 in the first direction X, with the signal lines S2 and S3 interposed between the sub-pixel PXW and the sub-pixels PEG2 and PER2.

The light-shielding layer SH is shaped along the boundaries between sub-pixels PX, and made up of a plurality of extension portions formed in the shape of a band. The light-shielding layer SH is located opposite to the scanning lines G1 to G3 and the signal lines S1 to S4. Also, the light-shielding layer SH is located opposite to the switching elements each of which is simplified in FIG. 5. Areas surrounded by the light-shielding layer SH serve as areas for use in displaying an image. Part of the light-shielding layer SH which is located opposite to the signal lines S2 and S3, has a greater width in the first direction X than that of part of the light-shielding layer SH which is located opposite to the signal line S1 or that of part of the light-shielding layer SH which is located opposite to the signal S4. Furthermore, part of the light-shielding layer SH which is located opposite to the scanning line G1, G2 or G3, has a greater width in the second direction Y than that of part of the light-shielding layer SH which is located between the sub-pixels PXG1 and PXR1 or that of part of the light-shielding layer SH which is located between the sub-pixels PXG2 and PXR2.

Furthermore, in the embodiment, since the pixel electrodes PER1, PEG2 and PEB are electrically connected to the scanning line G2, the pixel electrode PER1 functions as a first pixel electrode, the pixel electrode PEG2 functions as a second pixel electrode, and the pixel electrode PEB functions as a third pixel electrode. Thus, the third pixel electrode is located opposite to the first pixel electrode in the first direction X.

It should be noted that unlike the embodiment, in the case where the pixel electrode PEB is electrically connected to the scanning line G1 via the switching element SWB, and the pixel electrode PEW is electrically connected to the scanning line G2 via the switching element SWW, the pixel electrode PEW functions as the third pixel electrode in place of the pixel electrode PEB. In this case, the third pixel electrode is located opposite to the second pixel electrode in the first direction X. In any case, the third pixel electrode is located opposite to one of the first pixel electrode and the second pixel electrode in the first direction X.

Figure 6:
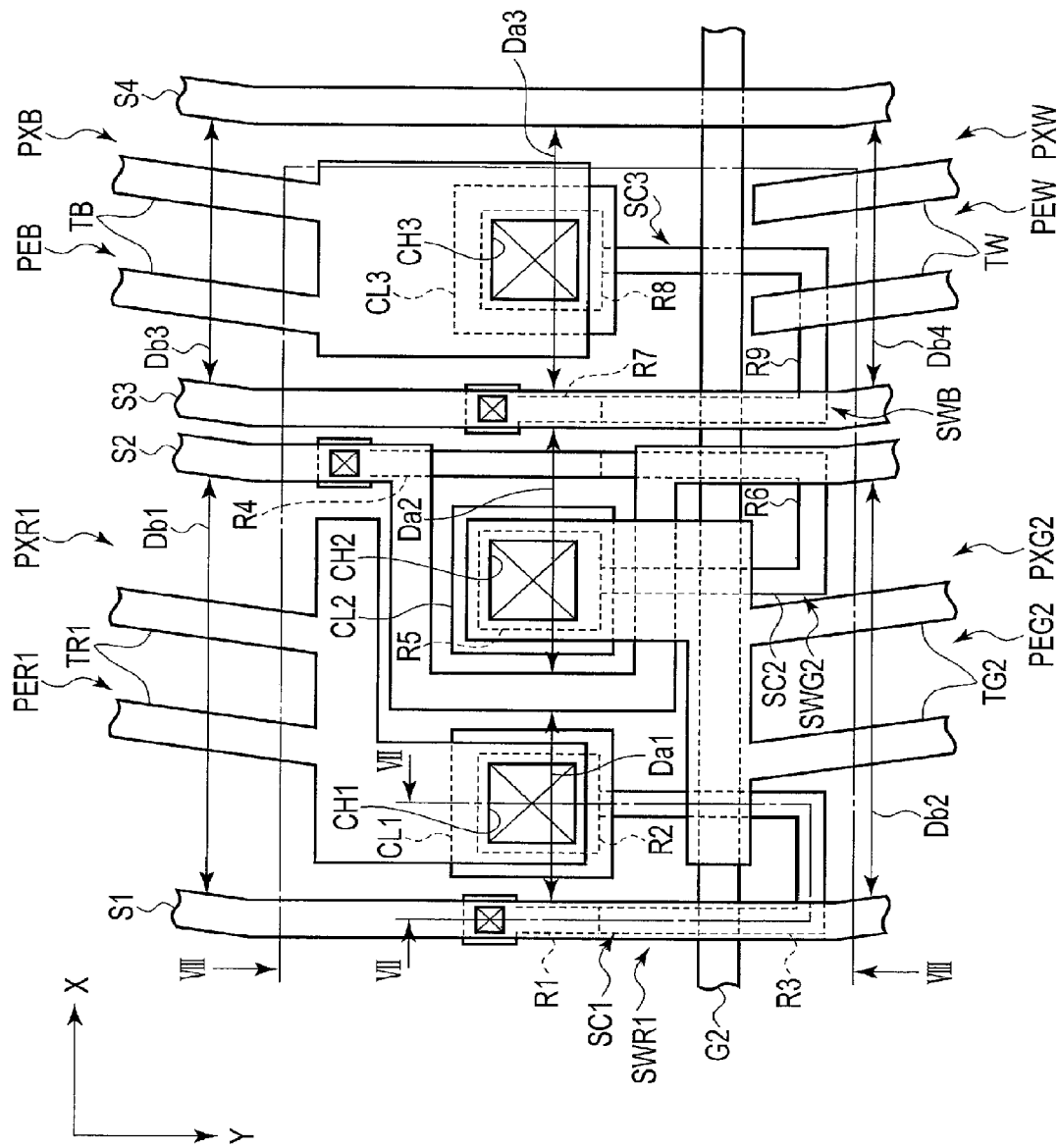
FIG. 6 is an enlarged plan view of part of the unit pixel as shown in FIG. 5.

FIG. 6 is an enlarged view of part of the unit pixel UPX1 shown in FIG. 5.

As shown in FIG. 6, each of sub-pixels PX includes a conductive layer CL. To be more specific, the sub-pixel PXR1 includes a conductive layer CL1 (first conductive layer) located between the signal lines S1 and S2. The sub-pixel PXG2 includes a conductive layer CL2 (second conductive layer) located between the signal lines S2 and S3. The sub-pixel PXB includes a conductive layer CL3 (third conductive layer) located between the signal lines S3 and S4. The conductive layers CL1 to CL3 are arranged in the first direction X. In a line extending in the first direction X and intersecting the conductive layers CL1 to CL3, the signal lines S and the conductive layers CL are alternately located.

It should be noted that the pixel electrode PER1 (first pixel electrode) is located to extend through a contact hole CH1 (first contact hole) to contact the conductive layer CL1, and is electrically connected to the switching element SWR1 (first switching element).

The pixel electrode PEG2 (second pixel electrode) is located to extend through a contact hole CH2 (second contact hole) to contact the conductive layer CL2, and is electrically connected to the switching element SWG2 (second switching element).

The pixel electrode PEB (third pixel electrode) is located to extend through a contact hole CH3 (third contact hole) to contact the conductive layer CL3, and is electrically connected to the switching element SWB (third switching element).

The contact holes CH1 to CH3, as well as the conductive layers CL1 to CL3, are arranged in the first direction X. In a line extending in the first direction X and intersecting the contact holes CH1 to CH3, the signal lines S and the contact holes CH are alternately located.

Each of the switching elements SW includes a semiconductor layer SC.

The switching element SWR1 includes a semiconductor layer SC1 (first semiconductor layer). The semiconductor layer SC1 includes a first region R1 electrically connected to the signal line S1, a second region R2 electrically connected to the pixel electrode PER1 via the conductive layer CL1, and a third region R3 located between the first region R1 and the second region R2.

The switching element SWG2 includes a semiconductor layer SC2 (second semiconductor layer). The semiconductor layer SC2 includes a fourth region R4 electrically connected to the signal line S2, a fifth region R5 electrically connected to the pixel electrode PEG2 via the conductive layer CL2, and a sixth region R6 located between the fourth region R4 and the fifth region R5.

The switching element SWB includes a semiconductor layer SC3 (third semiconductor layer). The semiconductor layer SC3 includes a seventh region R7 electrically connected to the signal line S3, an eighth region R8 electrically connected to the pixel electrode PEB via the conductive layer CL3, and a ninth region R9 located between the seventh region R7 and the eighth region R8.

In the embodiment, as seen from above, in an X-Y plane, the sub-pixel PXR1 and PXB are located on an upper side, the sub-pixels PXG2 and PXW are located on a lower side, the third, sixth and ninth regions R3, R6 and R9 are each U-shaped, and each intersect the scanning line G2 in two positions. Thus, each of the switching elements SW is formed of a double-gate thin-film transistor.

The pixel electrode PER1 includes a pectinate electrode TR1. The pixel electrode PEG2 includes a pectinate electrode TG2. The pixel electrode PEB includes a pectinate electrode TB. The pixel electrode PEW includes a pectinate electrode TW. The pectinate electrodes TR1 and TB extend in parallel with each other, and in the example shown in FIG. 6, they extend in a direction inclined at an acute angle in a clockwise direction with respect to the second direction Y. The pectinate electrodes TG2 and TW extend in parallel with each other, and in the example shown in FIG. 6, they extend in a direction inclined at an acute angle in a counter-clockwise direction with respect to the second direction Y. The pectinate electrodes TR1, TG2, TB and TW all extend in a direction away from the scanning line G2.

The signal line S2 is formed to bypass the conductive layer CL2 and the contact hole CH2, and located apart from the conductive layer CL2 and the contact hole CH2.

With respect to the distance between the signal lines S1 and S2 in the first direction X, the distance (first specific distance) between portions of the signal lines S1 and S2 which intersect the contact hole CH1 is Da1, the distance (first formal distance) between portions of the signal lines S1 and S2 which intersect the pectinate electrode TR1 (pixel electrode PER1) is Db1, and the distance (second formal distance) between portions of the signal lines S1 and S2 which intersect the pectinate electrode TG2 (pixel electrode PEG2) is Db2.

With respect to the distance between the signal lines S2 and S3 in the first direction X, the distance (second specific distance) between portions of the signal lines S2 and S3 which intersect the contact hole CH2 is Da2.

With respect to the distance between the signal lines S3 and S4 in the first direction X, the distance (third specific distance) between portions of the signal lines S3 and S4 which intersect the contact hole CH3 is Da3, the distance (third formal distance) between portions of the signal lines S3 and S4 which intersect the pectinate electrode TB (pixel electrode PEB) is Db3, and the distance (fourth formal distance) between portions of the signal lines S3 and S4 which intersect the pectinate electrode TW (pixel electrode PEW) is Db4.

In the embodiment, the distance Da1 is smaller than each of the distances Db1 and Db2 (Da1<Db1, and Da1<Db2). The distance Da2 is smaller than each of the distances Db1 and Db2 (Da2<Db1, and Da2<Db2). The distance Da3 is equal to the distance Db3 (Da3=Db3) or nearly equal to the distance Db3.

The distance Da1 is nearly equal to the distance Da2. In the first direction X, the conductive layers CL1 and CL2, the contact holes CH1 and CH2 and the signal lines S1 to S3 can be efficiently arranged. This reduces the sizes of the sub-pixels such as the sub-pixels PXR1 and PXG2 in the first direction X. In the case where the distances Da1 and Da2 are equal to each other (Da1=Da2), the conductive layers CL1 and CL2, the contact holes CH1 and CH2 and the signal lines S1 to S3 can be most efficiently arranged in the first direction X. This is because in the first direction X, the distance between the signal line S1 and the conductive layer CL1, that between the conductive layer CL1 and the signal line S2, that between the signal line S2 and the conductive line CL2 and that between the conductive layer CL2 and the signal line S3 can be equalized to each other.

Figure 7:
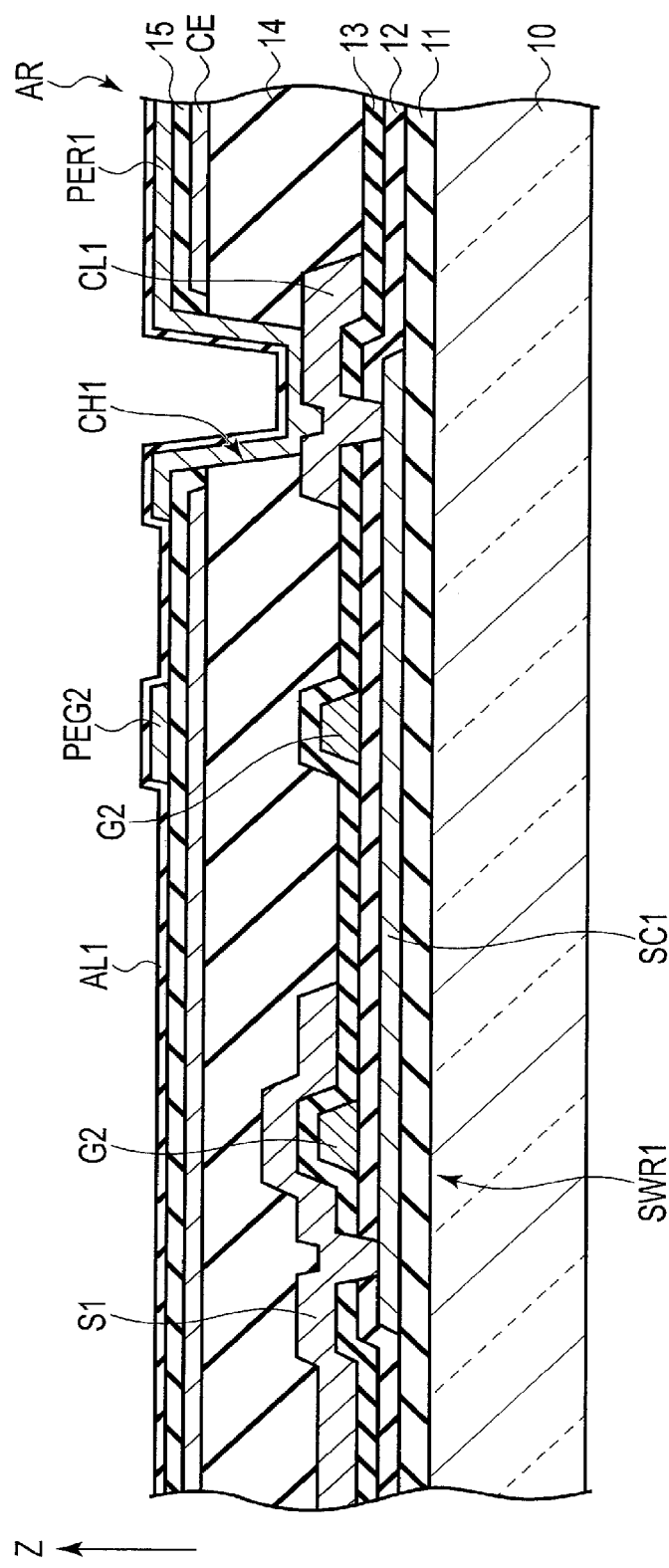
FIG. 7 is a cross-sectional view of the array substrate which is taken along line VII-VII in FIG. 6.

FIG. 7 is a schematic cross-sectional view of the array substrate AR which is taken along line VII-VII in FIG. 6.

As shown in FIG. 7, the array substrate AR is formed using a first insulating substrate 10 having a light transmitting property such as a glass substrate or a resin substrate. The array substrate AR comprises a first insulating film 11, a second insulating film 12, a third insulating film 13, a fourth insulating film 14, a fifth insulating film 15, a switching element SWR1, pixel electrodes PER1 and PEG2, a common electrode CE, a first alignment film AL1, etc. In the example shown in FIG. 7, the switching element SWR1 has a top-gate structure, but it may have a bottom-gate structure.

The first insulating film 11 is disposed on the first insulating substrate 10. In addition, the semiconductor layer SC1 of the pixel switching element SWG1 is formed on the first insulating film 11. The semiconductor layer SC1 is formed of, for example, polycrystalline silicon, but it may be formed of amorphous silicon, an oxide semiconductor or the like.

The second insulating film 12 is formed on the first insulating film 11 and the semiconductor layer SC1. The scanning line G2 is formed on the second insulating film 12, and located opposite to the semiconductor layer SC1 in two positions. The third insulating film 13 is formed on the scanning line G2 and the second insulating film 12. The signal line S1 and the conductive layer CL1 are formed on the third insulating film 13. The signal line S1 is in contact with the semiconductor layer SC1 through a contact hole formed in the second insulating film 12 and the third insulating film 13. The conductive layer CL1 is in contact with the semiconductor layer SC1 through another contact hole formed in the second insulating film 12 and the third insulating film 13.

The fourth insulating film 14 is formed on the third insulating film 13, the signal line S1 and the conductive layer CL1. The common electrode CE is formed on the fourth insulating film 14. The fifth insulating film 15 is formed on the fourth insulating film 14 and the common electrode CE. The first insulating film 11, the second insulating film 12, the third insulating film 13 and the fifth insulating film 15 are formed of an inorganic material, for example, silicon nitride (SiN) or silicon oxide (SiO). The fourth insulating film 14 is formed of an organic material, for example, an acrylic resin.

The pixel electrodes PER1 and PEG2 are formed on the fifth insulating film 15. The pixel electrode PER1 is in contact with the conductive layer CL1 through the contact hole CH1 formed in the fourth insulating film 14 and the fifth insulating film 15. The common electrode CE and the pixel electrode PEG1 are formed of a conductive material. For example, the common electrode CE and the pixel electrode PEG1 are formed of a transparent conductive material such as indium zinc oxide (IZO) or indium tin oxide (ITO). The alignment film AL1 is formed on the fifth insulating film 15 and the pixel electrodes PER1 and PEG2. The first alignment film AL1 is formed of, for example, a material which exhibits a horizontal alignment property.

Figure 8:
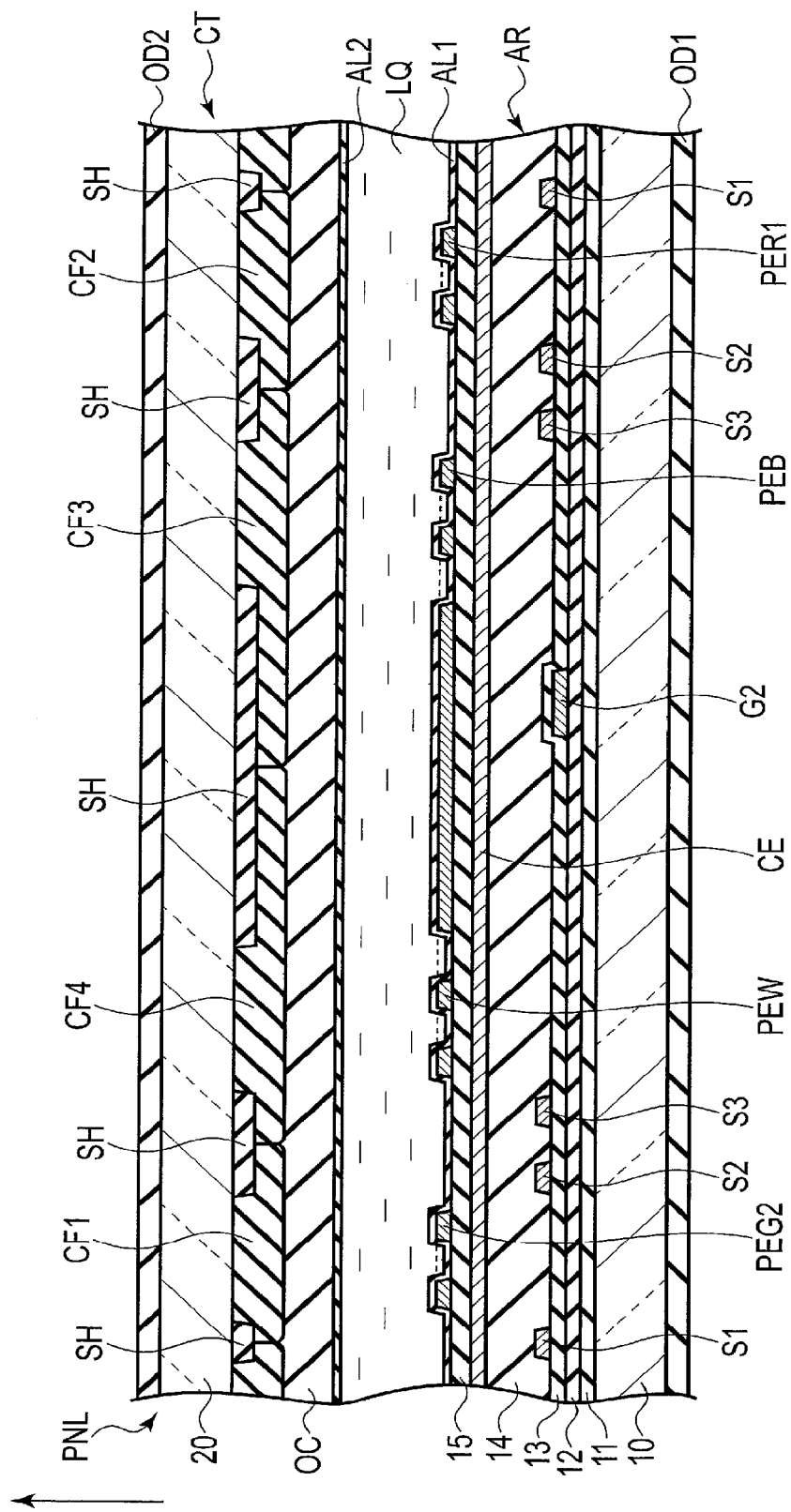
FIG. 8 is a cross-sectional view of the liquid crystal display panel which is taken along line VIII-VIII in FIG. 6.

FIG. 8 is a schematic cross-sectional view showing the liquid crystal display panel PNL which is taken along line VIII-VIII in FIG. 6.

As shown in FIG. 8, in the array substrate AR, the scanning line G2 is formed on the second insulating film 12 and covered by the third insulating film 13. The signal lines S1 to S3 are formed on the third insulating film 13 and covered by the fourth insulating film 14. The common electrode CE is formed on the fourth insulating film 14 and covered by the fifth insulating film 15. It should be noted that in the example shown in FIG. 8, the common electrode CE extends such that it is also located opposite to the scanning line G2 and the signal lines S1 to S3. The pixel electrodes PER1, PEG2, PEB and PEW are formed on the fifth insulating film 15 and covered by the first alignment film AL1. The pixel electrodes PER1 and PEG2 are located opposite to the common electrode CE in space between the signal lines S1 and S2.

The counter-substrate CT is formed using a second insulating substrate 20 having a light transmission property such as a glass substrate or a resin substrate. The counter-substrate CT comprises the light-shielding layer SH, color filters CF1 to CF4, an overcoat layer OC, a second alignment film AL2, etc.

The light-shielding layer SH is formed on a side of the second insulating substrate 20 which is located opposite to the array substrate AR. The light-shielding layer SH is located opposite to the scanning line G2 and the signal lines S1 to S3. The color filter CF1 is located opposite to the pixel electrode PEG2. The color filter CF2 is located opposite to the pixel electrode PER1. The color filter CF3 is located opposite to the pixel electrode PEB. The color filter CF4 is located opposite to the pixel electrode PEW. End portions of the color filters CF1 to CF4 overlap with the light-shielding layer SH. As described above, for example, the color filter CF1 is a green filter, the color filter CF2 is a red filter, the color filter CF3 is a blue filter, and the color filter CF4 is a non-tinted filter. The overcoat layer OC is formed of a transparent resin material and covers the color filters CF1 to CF4. The second alignment film AL2 is formed on a side of the overcoat layer OC which is located opposite to the array substrate AR. The second alignment film AL2 is formed of a material exhibiting a horizontal alignment property.

It should be noted that in the example shown in FIG. 8, the color filters CF1 to CF4 are formed in the counter-substrate CT, but may be formed in the array substrate AR.

Figure 9:
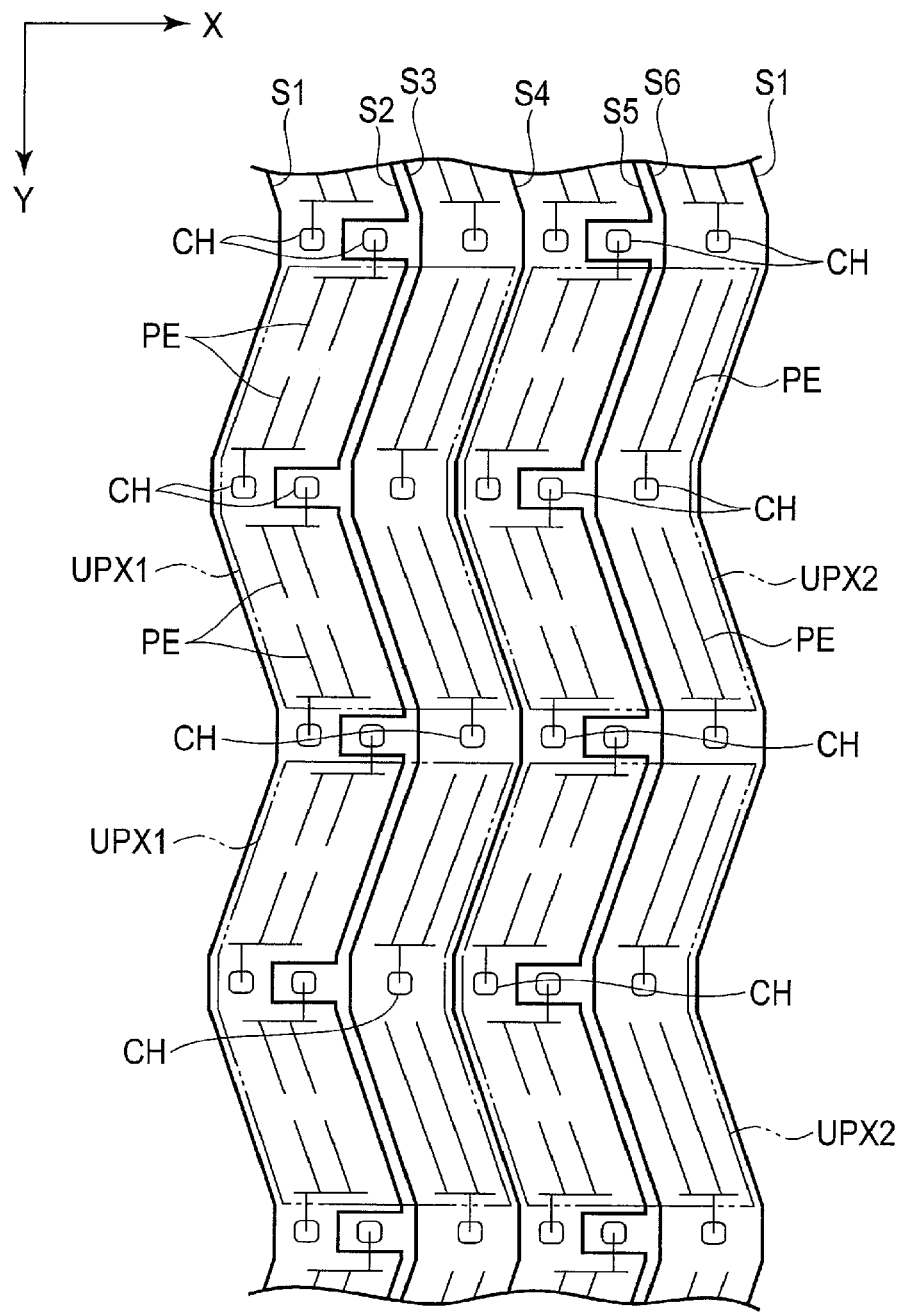
FIG. 9 is a configuration view of part of the array substrate, and also showing signal lines, contact holes and pixel electrodes.

FIG. 9 is a schematic configuration view showing part of the array substrate AR, and also showing the signal lines S, the contact holes CH and the pixel electrodes PE.

As shown in FIG. 9, the signal lines S1 to S3 are shared among unit pixels UPX1 arranged in the second direction Y. The signal lines S4 to S6 are shared among unit pixels UPX2 arranged in the second direction Y. In the embodiment, the signal lines S2 and S5 extend in the second direction Y, and bypass the contact holes CH.

In the embodiment, as the display device having the above structure, the liquid crystal display device DSP comprises the signal lines S1 and S2, the switching elements SWR1 and SWG2, insulating films (fourth and fifth insulating films 14 and 15), the contact holes CH1 and CH2, and the pixel electrodes PER1 and PEG2. The fourth insulating film 14 and the fifth insulating film 15 are located above the switching elements SWR1 and SWG2 and the signal lines S1 and S2. The contact hole CH1 is formed in the fourth insulating film 14 and the fifth insulating film 15, and located between the signal lines S1 and S2. The contact hole CH2 is formed in the fourth insulating film 14 and the fifth insulating film 15, located opposite to the contact hole CH1 with respect to the signal line S2, and adjacent to the contact hole CH1 in the first direction X. The pixel electrodes PER1 and PEG2 are formed above the fourth insulating film 14 and located opposite to each other in the second direction Y.

In the case where the contract holes CH1 and CH2 are arranged in the first direction X, they need to be separated from each other by a specific distance or more. In view of this, the signal line S2 is formed in such a manner as to bypass the contact hole CH2 and extend in space between the contact holes CH1 and CH2. Thus, the space between the contact holes CH1 and CH2 is effectively used. This can reduce the pitch of the sub-pixels PXR1 and PXG2, etc., in the first direction X, as compared with the case where between the signal lines S1 and S2, two contact holes (contact holes CH1 and CH2) are arranged in the first direction X. Furthermore, in view of a color balance, the pitch of the sub-pixels PXB, etc., can also be reduced in association with the pitch of, for example, the sub-pixels PXR1 and PXG2. For the above reason, the unit pixels UPX can be made smaller, and in addition, the resolution can be made higher.

Furthermore, with respect to the light-shielding layer SH located opposite to the scanning lines G2, the contact holes CH1 and CH2 and the conductive layers CL1 and CL2, the width of the light-shielding layer SH in the second direction Y can be made smaller than that in the case where the contact holes CH1 and CH2 are not arranged in the first direction X (the contact holes CH1 and CH2 are displaced from each other in the second direction Y). Therefore, in the case where it is designed that the resolution is made higher, it is possible to restrict reduction of the aperture ratio of each of the sub-pixels (the ratio of an area contributing to formation of an image to be displayed to the entire area). In even a display device having a high resolution of 400 ppi or more or 600 ppi, it is possible to restrict reduction of the aperture ratio of each of the sub-pixels. It should be noted that ppi means pixels per inch; however, in the embodiment, ppi indicates the number of main pixels MPX per inch. That is, the above pixels mean main pixels MPX.

For the above reason, according to the embodiment, it is possible to obtain a display device having a higher resolution.

Next, a liquid crystal display device DSP according to modification 1 of the above embodiment will be explained.

Figure 10:
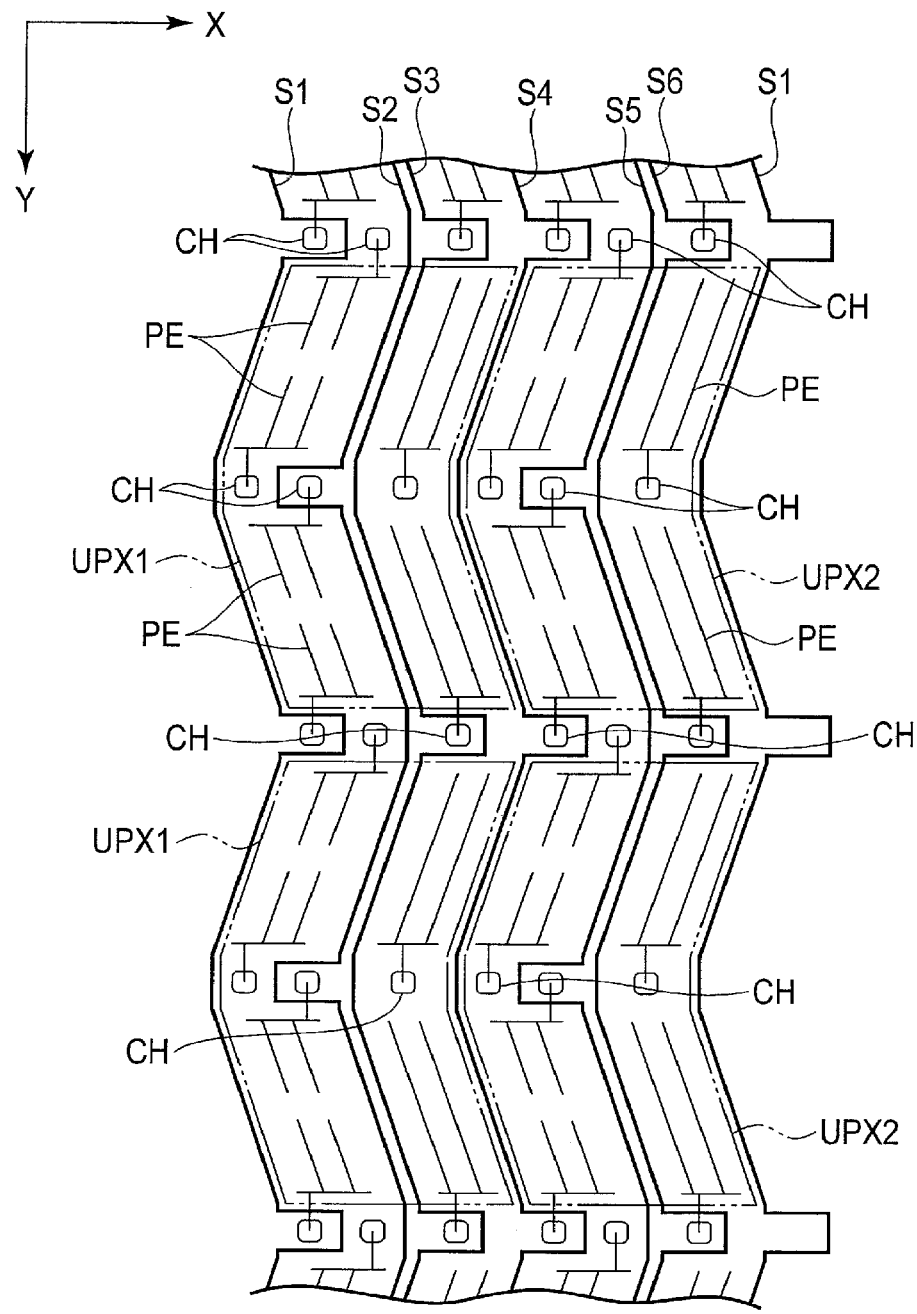
FIG. 10 is a configuration view of part of an array substrate in a liquid crystal display device according to modification 1 of the above embodiment, and also shows signal lines, contact holes and pixel electrodes.

FIG. 10 is a schematic configuration view showing part of an array substrate AR of the liquid crystal display device DSP according to modification 1, and also showing signal lines S, contact holes CH and pixel electrodes PE.

As shown in FIG. 10, all the signal lines S may be provided to extend in the second direction Y, while bypassing the contact holes CH. In modification 1, each of the signal lines S bypasses every other one of associated contact holes CH arranged in the second direction Y. It should be noted that in modification 1 also, contact holes CH are arranged in the first direction X, and in a line extending in the first direction X and intersecting the contact holes CH, the signal lines S and the contact holes CH are alternately located.

By virtue of the above structure, in modification 1 also, it is possible to obtain the same advantage as in the above embodiment. Furthermore, all the signal lines S are provided to bypass the contact holes CH. It is therefore possible to make uniform interconnection resistances for the signal lines S.

Next, a liquid crystal display device DSP according to modification 2 of the above embodiment will be explained.

FIG. 11 is a schematic configuration view showing part of an array substrate AR of the liquid crystal display device DSP according to modification 2, and also showing signal lines S, contact holes CH and pixel electrodes PE.

As shown in FIG. 11, in each of unit pixels UPX1, a pixel electrode PEB (third pixel electrode) is located opposite to both a pixel electrode PEG1 (first pixel electrode) and a pixel electrode PER1 (second pixel electrode) in the first direction X. Also, in each unit pixel UPX1, a pixel electrode PEW (third pixel electrode) is located opposite to both a pixel electrode PEG2 (first pixel electrode) and a pixel electrode PER2 (second pixel electrode) in the first direction X. In each of unit pixels UPX2, a pixel electrode PEW (third pixel electrode) is located opposite to both a pixel electrode PEG1 (first pixel electrode) and a pixel electrode PER1 (second pixel electrode) in the first direction X. Also, in each unit pixel UPX2, a pixel electrode PEB (third pixel electrode) is located opposite to both a pixel electrode PEG2 (first pixel electrode) and a pixel electrode PER2 (second pixel electrode) in the first direction X.

It should be noted that in modification 2 also, a plurality of contact holes CH are arranged in the first direction X, and in a line extending in the first direction X and intersecting the contact holes CH, the signal lines S and the contact holes CH are alternately located.

By virtue of the above structure, in modification 2 also, it is possible to obtain the same advantage as in the above embodiment.

Next, a liquid crystal display device DSP according to modification 3 of the above embodiment will be explained.

FIG. 12 is a schematic configuration view showing part of an array substrate AR of the liquid crystal display device DSP according to modification 3, and also showing signal lines S, contact holes CH and pixel electrodes PE.

As shown in FIG. 12, the liquid crystal display panel PNL includes a plurality of unit pixels UPX arranged in a matrix. Each of the unit pixels UPX is made up of a single main pixel MPX. To be more specific, each unit pixel UPX is made up of four adjacent sub-pixels, i.e., a sub-pixel PXR of the above second color, a sub-pixel PXW of the above fourth color, a sub-pixel PXG of the above first color, and a sub-pixel PXB of the above third color.

The liquid crystal display panel PNL includes signal lines S1 to S4. The signal lines S1 to S4 are each shared among unit pixels UPX arranged in the second direction Y. Also, contact holes CH are arranged in the first direction X. The signal lines S2 and S4 extend in the second direction Y, and bypass contact holes CH arranged in the second direction Y. Thus, in a line extending in the first direction X and intersecting the contact holes CH, the signal lines S and the contact holes CH are alternately located.

FIG. 13 is an enlarged plan view of part of a unit pixel UPX as shown in FIG. 12.

As shown in FIG. 13, the sub-pixel PXR includes a conductive layer CL1 (first conductive layer) located between the signal lines S1 and S2. The sub-pixel PXW includes a conductive layer CL2 (second conductive layer) located between the signal lines S2 and S3. The sub-pixel PXG includes a conductive layer CL3 (third conductive layer) located between the signal lines S3 and S4. The sub-pixel PXB includes a conductive layer CL4 (fourth conductive layer) located between the signal lines S4 and S1. The conductive layers CL1 to CL4 are arranged in the first direction. In a line extending in the first direction X and intersecting the conductive layers CL1 to CL4, the signal lines S and the conductive layers CL are alternately located.

It should be noted that a pixel electrode PER (first pixel electrode) is provided such that it extends through a contact hole CH1 (first contact hole) to contact the conductive layer CL1, and is electrically connected to a switching element SWR (first switching element).

A pixel electrode PEW (second pixel electrode) is provided such that it extends through a contact hole CH2 (second contact hole) to contact the conductive layer CL2, and is electrically connected to a switching element SWW (second switching element).

A pixel electrode PEG (third pixel electrode) is provided such that it extends through a contact hole CH3 (third contact hole) to contact the conductive layer CL3, and is electrically connected to a switching element SWG (third switching element).

A pixel electrode PEB (fourth pixel electrode) is provided such that it extends through a contact hole CH4 (fourth contact hole) to contact the conductive layer CL4, and is electrically connected to a switching element SWB (fourth switching element).

The contact holes CH1 to CH4, as well as the conductive layers CL1 to CL4, are arranged in the first direction X. In a line extending in the first direction X and intersecting the contact holes CH1 to CH4, the signal lines S and the contact holes CH are alternately located.

The switching element SWR includes a semiconductor layer SC1 (first semiconductor layer). The semiconductor layer SC1 includes a first region R1 electrically connected to the signal line S1, a second region R2 electrically connected to the pixel electrode PER via the conductive layer CL1, and a third region R3 located between the first region R1 and the second region R2.

The switching element SWW includes a semiconductor layer SC2 (second semiconductor layer). The semiconductor layer SC2 includes a fourth region R4 electrically connected to the signal line S2, a fifth region R5 electrically connected to the pixel electrode PEW via the conductive layer CL2, and a sixth region R6 located between the fourth region R4 and the fifth region R5.

The switching element SWG includes a semiconductor layer SC3 (third semiconductor layer). The semiconductor layer SC3 includes a seventh region R7 electrically connected to the signal line S3, an eighth region R8 electrically connected to the pixel electrode PEG via the conductive layer CL3, and a ninth region R9 located between the seventh region R7 and the eighth region R8.

The switching element SWB includes a semiconductor layer SC4 (fourth semiconductor layer). The semiconductor layer SC4 includes a tenth region R10 electrically connected to the signal line S4, an eleventh region R11 electrically connected to the pixel electrode PEB via the conductive layer CL4, and twelfth region R12 located between the tenth region R10 and the eleventh region R11.

In the embodiment, as seen from above, in an X-Y plane, the sub-pixel PXR and PXG are located on an upper side, the sub-pixels PXW and PXB are located on a lower side, the third, sixth, ninth and twelfth regions R3, R6, R9 and R12 are each U-shaped, and each intersect the scanning line G in two positions. Thus, each of the switching elements SW is formed of a double-gate thin-film transistor.

The signal line S2 is formed to bypass the conductive layer CL2 and the contact hole CH2, and located apart from the conductive layer CL2 and the contact hole CH2. The signal line S4 is formed to bypass the conductive layer CL4 and the contact hole CH4, and located apart from the conductive layer CL4 and the contact hole CH4.

It should be noted that in modification 3 also, contact holes CH are arranged in the first direction X, and in a line extending in the first direction X and intersecting the contact holes CH, the signal lines S and the contact holes CH are alternately located.

By virtue of the above structure, in modification 3 also, it is possible to obtain the same advantage as in the above embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the liquid crystal display panel PNL according to the above embodiment has a structure adapted for a FFS mode which is a display mode; however, it may have a structure adapted for another display mode. For example, the liquid crystal display panel PNL may have a structure adapted for an in-plane switching (IPS) mode such as the FFS mode, which primarily utilizes a lateral electric field substantially parallel to a main surface of the substrate. In a display mode utilizing a lateral electric field, it is possible to apply a structure including, for example, an array substrate AR provided with pixel electrodes PE and a common electrode CE. Alternatively, the liquid crystal display panel PNL may have a structure adapted for a mode primarily utilizing a vertical electric field substantially perpendicular to the main surface of the substrate, such as a twisted nematic (TN) mode, an optically compensated bend (OCB) mode or a vertical aligned (VA) mode. In the display mode utilizing the vertical electric field, for example, it is possible to apply a structure provided with an array substrate AR including pixel electrodes PE and a counter-substrate CT including a common electrode CE. It should be noted that the main surface of the substrate is a surface parallel to an X-Y plane defined in the first direction X and the second direction Y.

Each of the switching elements SW may be formed of a single-gate thin-film transistor, not a double-gate thin-film transistor.

The above embodiment is not limited to the above liquid crystal display device; that is, it can be applied to various display devices. Needless to say, the above embodiment can be applied to middle or small display devices and large display devices with no specific limitation.

What is claimed is:
1. A display device comprising:
a first signal line;
a second signal line spaced from the first signal line;
a first switching element connected to the first signal line;
a second switching element connected to the second signal line;
an insulating film provided above the first switching element, the second switching element, the first signal line and the second signal line;
a first contact hole formed in the insulating film and located between the first and second signal lines;
a second contact hole formed in the insulating film, located opposite to the first contact hole with respect to the second signal line, and also located side by side with the first contact hole in a first direction;
a first pixel electrode formed above the insulating film, and electrically connected to the first switching element through the first contact hole; and
a second pixel electrode formed above the insulating film, electrically connected to the second switching element through the second contact hole, and located opposite to the first pixel electrode in a second direction perpendicular to the first direction.

2. The display device of claim 1, wherein with respect to a distance between the first and second signal lines in the first direction, a first specific distance between portions of the first and second signal lines which intersect the first contact hole is smaller than a first formal distance between portions of the first and second signal lines which intersect the first pixel electrode, and a second formal distance between portions of the first and second signal lines which intersect the second pixel electrode.

3. The display device of claim 1, further comprising:
a first conductive layer provided between the first and second signal lines; and
a second conductive layer provided opposite to the first conductive layer with respect to the second signal line, and located side by side with the first conductive layer in the first direction,
wherein
the insulating film is provided above the first and second signal lines and the first and second conductive layers,
the first pixel electrode is electrically connected to the first switching element via the first conductive layer, and
the second pixel electrode is electrically connected to the second switching element via the second conductive layer.

4. The display device of claim 1, wherein the first and second pixel electrodes are located between the first and second signal lines.

5. A display device of claim 1, wherein
the first switching element is formed of a thin-film transistor including a first semiconductor layer which comprises a first region electrically connected to the first signal line, a second region electrically connected to the first pixel electrode, and a third region located between the first region and the second region, and
the second switching element is formed of a thin-film transistor including a second semiconductor layer which comprises a fourth region electrically connected to the second signal line, a fifth region electrically connected to the second pixel electrode, and a sixth region located between the fourth region and the fifth region.

6. The display device of claim 1, further comprising:
a third signal line provided below the insulating film, located opposite to the first signal line with respect to the second signal line and the second contact hole, and spaced from the second signal line;
a third switching element below the insulating film, and connected to the third signal line;
a third contact hole formed in the insulating film, located opposite to the second contact hole with respect to the third signal line, and also located side by side with the first contact hole and the second contact hole in the first direction; and
a third pixel electrode formed above the insulating film, electrically connected to the third switching element through the third contact hole, and located opposite to at least one of the first pixel electrode and the second pixel electrode in the first direction.

7. The display device of claim 6, wherein a first specific distance between portions of the first and second signal lines which intersect the first contact hole is equal to a second specific distance between portions of the second and third signal lines which intersect the second contact hole in the first direction.

8. The display device of claim 1, further comprising:
a third signal line provided below the insulating film, located opposite to the first signal line with respect to the second signal line and the second contact hole, and spaced from the second signal line;
a fourth signal line provided below the insulating film, located opposite to the second signal line with respect to the third signal line, and spaced from the third signal line;
a third switching element provided below the insulating film, and connected to the third signal line;
a fourth switching element provided below the insulating film, and connected to the fourth signal line;
a third contact hole formed in the insulating film, located between the third and fourth signal lines, and also located side by side with the first and second contact holes in the first direction;
a fourth contact hole formed in the insulating film, located opposite to the third contact hole with respect to the fourth signal line, and also located side by side with the first to third contact holes in the first direction;
a third pixel electrode formed above the insulating film, and electrically connected to the third switching element through the third contact hole, and located opposite to the first pixel electrode in the first direction; and
a fourth pixel electrode formed above the insulating film, electrically connected to the fourth switching element through the fourth contact hole, and located opposite to the second pixel electrode in the first direction and to the third pixel electrode in the second direction.

* * * * *